(12) United States Patent
Hetherington

(10) Patent No.: US 12,072,404 B2
(45) Date of Patent: Aug. 27, 2024

(54) MAPPING AND CORRECTION OF INHOMOGENEITY IN MAGNETIC RESONANCE IMAGING MAGNETIC FIELD

(71) Applicant: Resonance Research, Inc., Billerica, MA (US)

(72) Inventor: Hoby P. Hetherington, Columbia, MO (US)

(73) Assignee: Resonance Research, Inc., Billerica, MA (US)

(*) Notice: Subject to any disclaimer, the term of this patent is extended or adjusted under 35 U.S.C. 154(b) by 0 days.

(21) Appl. No.: 18/036,968

(22) PCT Filed: Nov. 19, 2021

(86) PCT No.: PCT/US2021/060118
§ 371 (c)(1),
(2) Date: May 15, 2023

(87) PCT Pub. No.: WO2022/109287
PCT Pub. Date: May 27, 2022

(65) Prior Publication Data
US 2023/0324490 A1 Oct. 12, 2023

Related U.S. Application Data

(60) Provisional application No. 63/116,551, filed on Nov. 20, 2020.

(51) Int. Cl.
*G01R 33/565* (2006.01)
*G01R 33/24* (2006.01)
*G01R 33/3875* (2006.01)

(52) U.S. Cl.
CPC ..... *G01R 33/56563* (2013.01); *G01R 33/243* (2013.01); *G01R 33/3875* (2013.01)

(58) Field of Classification Search
CPC ............ G01R 33/56563; G01R 33/243; G01R 33/3875; G01R 33/387; G01R 33/3873; G01R 33/56545
See application file for complete search history.

(56) References Cited

U.S. PATENT DOCUMENTS

| 2008/0258725 A1 | 10/2008 | Hetherington et al. |
| 2014/0375318 A1 | 12/2014 | Dagher et al. |

(Continued)

FOREIGN PATENT DOCUMENTS

WO    WO-02082994 A1 * 10/2002    ......... G01R 33/4828

OTHER PUBLICATIONS

English translation of WO U.S. Appl. No. 02/082,994. 2023 (Year: 2023).*

(Continued)

*Primary Examiner* — Rishi R Patel
(74) *Attorney, Agent, or Firm* — BURNS & LEVINSON, LLP

(57) ABSTRACT

A system and method of mapping and correcting the inhomogeneity of a magnetic field within an object using an Magnetic Resonance Imaging (MRI) system where there is a single dominant resonance. The method includes acquiring at least three MRI images, each at different echo times (TE). At least two $\Delta TE$ images ($\Delta TE_{i=1 \ldots N}$) are generated based on the at least three MRI images, wherein the subscripts I=1 ... N refer to images with sequentially increasing $\Delta TE$ times. Aliasing in the $\Delta TE_1$ image is permitted. The $\Delta TE$ times of $\Delta TE_1$ and $\Delta TE_2$ are set such that the alias points at which wrapping occurs in $\Delta TE_1$ does not overlap with the alias points of $\Delta TE_2$. Each $\Delta TE$ image is unwrapped. A final B0 map is set to the unwrapped $\Delta TE_N$ image.

20 Claims, 10 Drawing Sheets

(56) References Cited

U.S. PATENT DOCUMENTS

2015/0355306 A1* 12/2015 Stemmer .............. G01R 33/543
  324/309
2019/0128991 A1 5/2019 Shirai et al.

OTHER PUBLICATIONS

Robinson, Simon, Horst Schödl, and Siegfried Trattnig. "A method for unwrapping highly wrapped multi-echo phase images at very high field: UMPIRE." Magnetic resonance in medicine 72.1 (2014): 80-92. (Year: 2014).*

Juchem, Christoph, et al. "B0 shimming for in vivo magnetic resonance spectroscopy: experts' consensus recommendations." NMR in Biomedicine 34.5 (Jun. 28, 2020): e4350. (Year: 2020).*

International Searching Authority—International Search Report, pertaining to International Application No. PCT/US2021/060118 dated Feb. 8, 2022, together with the Written Opinion of the International Searching Authority, 12 pages.

Dagher et al., "High-resolution, large dynamic range field map estimation," Magn Reson Med. 71(1):105-117, DOI: 10.1002/mrm.24636 (2014), 24 pages.

Geiger et al., "Optimal echo times for multi-gradient echo-based B0 field-mapping," NMR in Biomed, 33(7):e4316, DOI: 10.1002/nbm.4316 (2020), 17 pages.

Hetherington et al., "Robust fully automated shimming of the human brain for high-field 1H spectroscopic imaging," Magnetic Resonance in Medicine 56:26-33, DOI: 10.1002/mrm.20941 (2006), 8 pages.

Jenkinson, M., "Fast, automated, N-dimensional phase-unwrapping algorithm," Magnetic Resonance in Medicine 49:193-197 (2003), 5 pages.

* cited by examiner

MAPPING AND CORRECTION OF INHOMOGENEITY IN MAGNETIC RESONANCE IMAGING MAGNETIC FIELD

CROSS-REFERENCE TO RELATED APPLICATIONS

This application claims priority from U.S. Provisional Patent Application 63/116,551, filed Nov. 20, 2020, which is incorporated herein by reference in its entirety.

TECHNICAL FIELD

The present invention relates to Nuclear Magnetic Resonance (NMR) and Magnetic Resonance Imaging (MRI), and more particularly to mapping the generated magnetic field ($B_0$); and correcting inhomogeneity in the generated magnetic field ($B_0$).

BACKGROUND ART

Nuclear Magnetic Resonance (NMR) and Magnetic Resonance Imaging (MRI) utilize strong magnets to generate a homogeneous magnetic field ($B_0$) across objects ranging from small sample tubes to the human body (FIG. 1). Although the magnets used are very homogeneous, small imperfections in the magnet result in spatial variations in magnetic field strength on the order of parts per million. Additionally, the field becomes even more inhomogeneous when the sample (e.g. tubes or people) are inserted into them. For example, for the human head, the interfaces between air (e.g. sinuses), bone (skull) and the soft tissue (brain) distort the magnetic field locally and lead to variations (i.e. inhomogeneity) in the $B_0$ field strength across the object. Since the measured frequency from a specific location varies linearly with $B_0$ strength at that location, a range in frequencies will be detected across the object. This results in unwanted broadening of the signals from the sample, thereby lowering the signal to noise ratio. Additionally, in MRI, this inhomogeneity also results in geometric distortions (stretching/compression) in the shape of the object being imaged.

To overcome these effects, passive iron shims or active $B_0$ correction coils, also known as $B_0$ shims or simply "shims" may be incorporated into the hardware used within the bore of the magnet. Active shims are designed such that each coil generates a unique spatial variation in B0 field, with its overall strength and sign determined by the amount of current applied to the individual coils. When applied to the object, these coils provide small $B_0$ correction fields; either increasing or decreasing the local $B_0$ field strength, so as to make the $B_0$ field across the object more spatially homogeneous. Thus, when the correct set of currents are applied to the individual active shims, the shims generate a spatially varying $B_0$ field distribution matching, but opposite in sign, to the distortions generated by the object and any residual imperfections in the magnet.

Placement of the shims and/or adjustment of the current applied to the active shims is optimally achieved by first accurately characterizing the spatial variation in $B_0$ field across the object by mapping the $B_0$ field. Once this has been accomplished, the amount of current used to drive each of the shim coils can be calculated using calibrated images of the specific $B_0$ fields generated by the individual shim coils. However, this process is dependent upon an accurate mapping of the existing $B_0$ field distribution. Further, for MRI Applications or high throughput NMR applications, it is important to keep the duration of these measurements as short as possible to maximize the available study time for the primary measurements. Thus methods which can enhance the accuracy of the measurement while minimizing the time required to make it are valuable tools for both NMR and MRI applications.

SUMMARY OF THE EMBODIMENTS

The system and methods of the various embodiments of the invention described below achieve rapid and highly accurate $B_0$ mapping that may be used, for example, to determine the placement of passive shims and/or shim currents for active shims for the purpose of reducing inhomogeneity when using Magnetic Resonance Imaging (MRI) systems. While the below described embodiments refer to MRI systems, it is to be understood that the invention is applicable to other imaging systems known in the art, such as, without limitation, Nuclear Magnetic Resonance (NMR) systems.

In accordance with an embodiment of the invention, a method is presented for mapping and correcting the inhomogeneity of a magnetic field within an object using an Magnetic Resonance Imaging (MRI) system (or NMR system) where there is a single dominant resonance. The method includes acquiring at least three MRI images, each at different echo times (TE). At least two $\Delta TE$ images ($\Delta TE_{i=1 \ldots N}$) are generated based on the at least three MRI images, wherein the subscripts I=1 . . . N refer to images with sequentially increasing $\Delta TE$ times. Aliasing in the $\Delta TE_1$ image is permitted. The $\Delta TE$ times of $\Delta TE_1$ and $\Delta TE_2$ are set such that the alias points at which wrapping occurs in $\Delta TE_1$ does not overlap with the alias points of $\Delta TE_2$. Each $\Delta TE$ images is unwrapped. A final $B_0$ map is set to the unwrapped $\Delta TE_N$ image.

In accordance with related embodiments of the invention, the method may further include determining shim currents and/or passive shims based on the final $B_0$ map, the shim currents for reducing $B_0$ inhomogeneity. The shim currents and/or passive shims may be applied to the sample to reduce $B_0$ inhomogeneity in the sample. The shim currents and/or passive shims may generate a $B_0$ field opposite in sign to the inhomogeneity of the magnetic field.

In accordance with another related embodiment of the invention, the at least two $\Delta TE$ images may differ in their echo time (TE) such that the difference in resulting phase ($\Delta \phi$) of any two $\Delta TE$ images varies according to $\Delta \phi = \Delta TE \cdot \Delta v$, where $\Delta v$ is the difference in frequency at a voxel in the image from a central frequency, and $\Delta TE$ is the difference in echo time between any pair of images.

In accordance with yet another embodiment of the invention, unwrapping each $\Delta TE$ image to form a final $B_0$ map include: unwrapping aliasing in the $\Delta TE_1$ image based on information in the next longest $\Delta TE$ image (the $\Delta TE_2$ image), to form an unwrapped $\Delta TE_1$ image; and using the unwrapped $\Delta TE_1$ image to unwrap the next longest $\Delta TE$ image (the $\Delta TE_2$ image). Unwrapping aliasing in the $\Delta TE_1$ and $\Delta TE_2$ images may include calculating a logistic temporal unwrapping parameter LTUP, where LTUP images the fractional difference measured between two $\Delta TE$ images into a set of values describing the extent of aliasing. Unwrapping each $\Delta TE$ image to form a final $B_0$ map may further include, for i=3 to N, using the previously unwrapped $\Delta TE_{i-1}$ image to unwrap the $\Delta TE_i$ image. Using the unwrapped $\Delta TE_1$ image to unwrap the next longest $\Delta TE$ image (the $\Delta TE_2$ image) may include using a numerical estimate of the difference between the unwrapped value in the $\Delta TE_1$ image with values representing different degrees of aliasing in the $\Delta TE_2$.

In accordance with still another embodiment of the invention, each of the MRI images may be acquired using gradient echo, asymmetric spin echo, and/or stimulated echo acquisitions. Acquiring each $\Delta TE$ image may include a single pattern matching algorithm to simultaneously unwrap each $\Delta TE$ images. Acquiring the at least three MRI images may include using simultaneous multi-slice methods, K-space undersampling in the phase encoding direction, and/or use of 2 and 3 dimensional readout trajectories, to decrease acquisition times.

In accordance with another embodiment of the invention, a system is presented for mapping and correcting the inhomogeneity of the magnetic field within an object using Magnetic Resonance Imaging (MRI) where there is a single dominant resonance. The system includes an MRI imaging device for acquiring at least three MRI images, each at different echo times (TE). The MM imaging device includes a controller. The controller is configured to generate at least two $\Delta TE$ images ($\Delta TE_{1=1 \ldots N}$) based on the at least three MRI images, wherein the subscripts i=1 . . . N refer to images with sequentially increasing $\Delta TE$ times; wherein aliasing in the $\Delta TE_1$ image is permitted, and wherein the $\Delta TE$ times of $\Delta TE_1$ and $\Delta TE_2$ are set such that the alias points at which wrapping occurs in $\Delta TE_1$ does not overlap with the alias points of $\Delta TE_2$. The controller is further configured to unwrap each $\Delta TE$ image, and set the final $B_0$ map to the unwrapped $\Delta TE_N$ image.

In accordance with related embodiments of the system, the controller may be further configured to determine shim currents and/or passive shims based on the final $B_0$ map, the shim currents or passive shims for reducing $B_0$ inhomogeneity. The controller may be further configured to apply the shim currents and/or passive shims to the sample to reduce $B_0$ inhomogeneity in the sample. The shim currents and/or passive shims may generate a $B_0$ field opposite in sign to the inhomogeneity of the magnetic field.

In accordance with another related embodiment of the invention, the at least two $\Delta TE$ images may differ in their echo time (TE) such that the difference in resulting phase ($\Delta \phi$) of any two MRI $\Delta TE$ images varies according to $\Delta \phi = \Delta TE \cdot \Delta v$, where $\Delta v$ is the difference in frequency at a voxel in the image from a central frequency, and $\Delta TE$ is the difference in echo time between any pair of images.

In accordance with a further related embodiment of the invention, wherein to unwrap each $\Delta TE$ image to form a final $B_0$ map, the controller may be configured to: unwrap aliasing in the $\Delta TE_1$ image is based on information in the next longest $\Delta TE$ image (the $\Delta TE_2$ image), to form an unwrapped $\Delta TE_1$ image, and use the unwrapped $\Delta TE$ image to unwrap the next longest $\Delta TE$ image (the $\Delta TE_2$ image). To unwrap aliasing in the $\Delta TE_1$ and $\Delta TE_2$ images, the controller may be configured to include calculating a logistic temporal unwrapping parameter LTUP, where LTUP images the fractional difference measured between two $\Delta TE$ images into a set of values describing the extent of aliasing. To unwrap each $\Delta TE$ image to form a final $B_0$ map, the controller may be configured, for i=3 to N, use the previously unwrapped $\Delta TE_{i-1}$ image to unwrap the $\Delta TE_i$ image. To use the unwrapped $\Delta TE_1$ image to unwrap the next longest $\Delta TE$ image (the $\Delta TE_2$ image), the controller may be further configured to use a numerical estimate of the difference between the unwrapped value in the $\Delta TE_1$ image with values representing different degrees of aliasing in the $\Delta TE_2$.

In accordance with still further embodiments of the invention, the MRI device may acquire each of the MRI images using gradient echo, asymmetric spin echo, and/or stimulated echo acquisitions. To unwrap each $\Delta TE$ image, the controller may be configured to use a single pattern matching algorithm to simultaneously unwrap each $\Delta TE$ images. The MRI device may be configured to acquire the at least three MRI images using simultaneous multi-slice methods, K-space undersampling in the phase encoding direction, and/or use of 2 and 3 dimensional readout trajectories, so as to decrease acquisition times.

BRIEF DESCRIPTION OF THE DRAWINGS

The foregoing features of embodiments will be more readily understood by reference to the following detailed description, taken with reference to the accompanying drawings, in which.

DETAILED DESCRIPTION OF SPECIFIC EMBODIMENTS

Definitions. As used in this description and the accompanying claims, the following terms shall have the meanings indicated, unless the context otherwise requires:

The term "image" refers to a dataset in which a parameter (s) such as, without limitation, phase, $B_0$ field variation etc. . . . , is provided as a two or three dimensional map reflecting the spatial variation of that parameter.

In illustrative embodiments of the invention, a system and method is provided for mapping and correcting the inhomogeneity of a magnetic field within an object using Magnetic Resonance Imaging (MRI) or Nuclear Magnetic Resonance (NMR) systems. The system and method includes logistical temporal unwrapping that enables the use of longer $\Delta TE$ images to unwrap aliasing in the shortest $\Delta TE$ image, and utilizes the patterns of aliasing in all images to unwrap the most accurate longer $\Delta TE$ image. Aliasing in the shortest $\Delta TE$ image is advantageously allowed, minimizing the need to accurately predict the maximum inhomogeneity present. Additionally, the $\Delta TE$ values used can lengthen by factors larger than two, enabling greater accuracy with fewer ΔTE images and thus shorter acquisition times. Details are described below.

Figure 1:
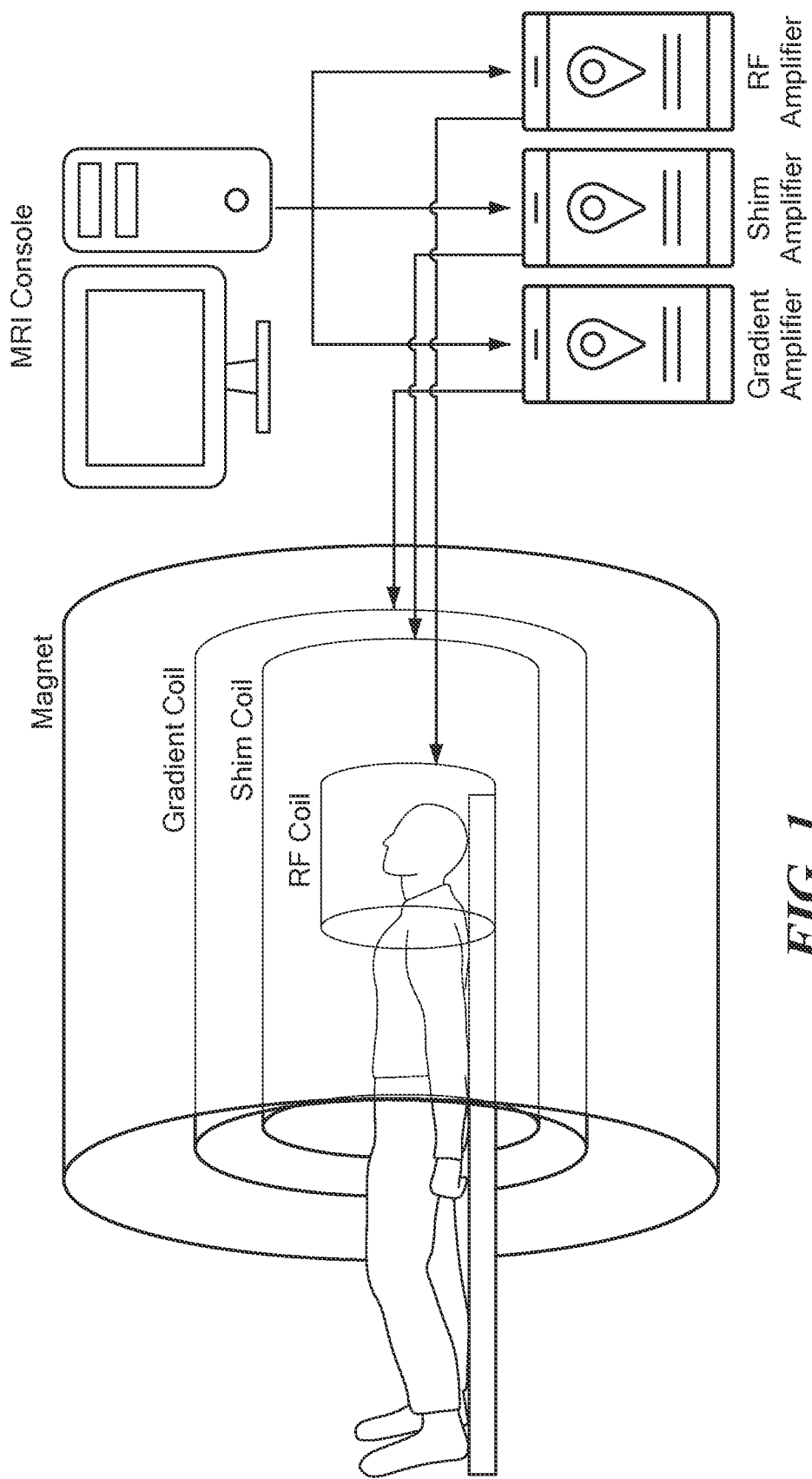
FIG. 1 shows a schematic of a Magnetic Resonance Imaging (MRI) system (prior art)

FIG. 1 shows a conventional Magnetic Resonance Imaging (MRI) system. The MRI system includes a magnet, gradient coil (used for spatial localization), shim coil (used to correct $B_0$ inhomogeneity) and RF coil (used for excitation and detection of signals). A controller, which may include a computer or other processing elements is used for control of the system. Shim and RF amplifiers may be used to drive their respective coils in the magnet. While the below described embodiments refer to MRI systems, it is to be understood that the invention is applicable to NMR or other imaging systems known in the art as well.

Performance Considerations for $B_0$ Mapping

Figure 2:
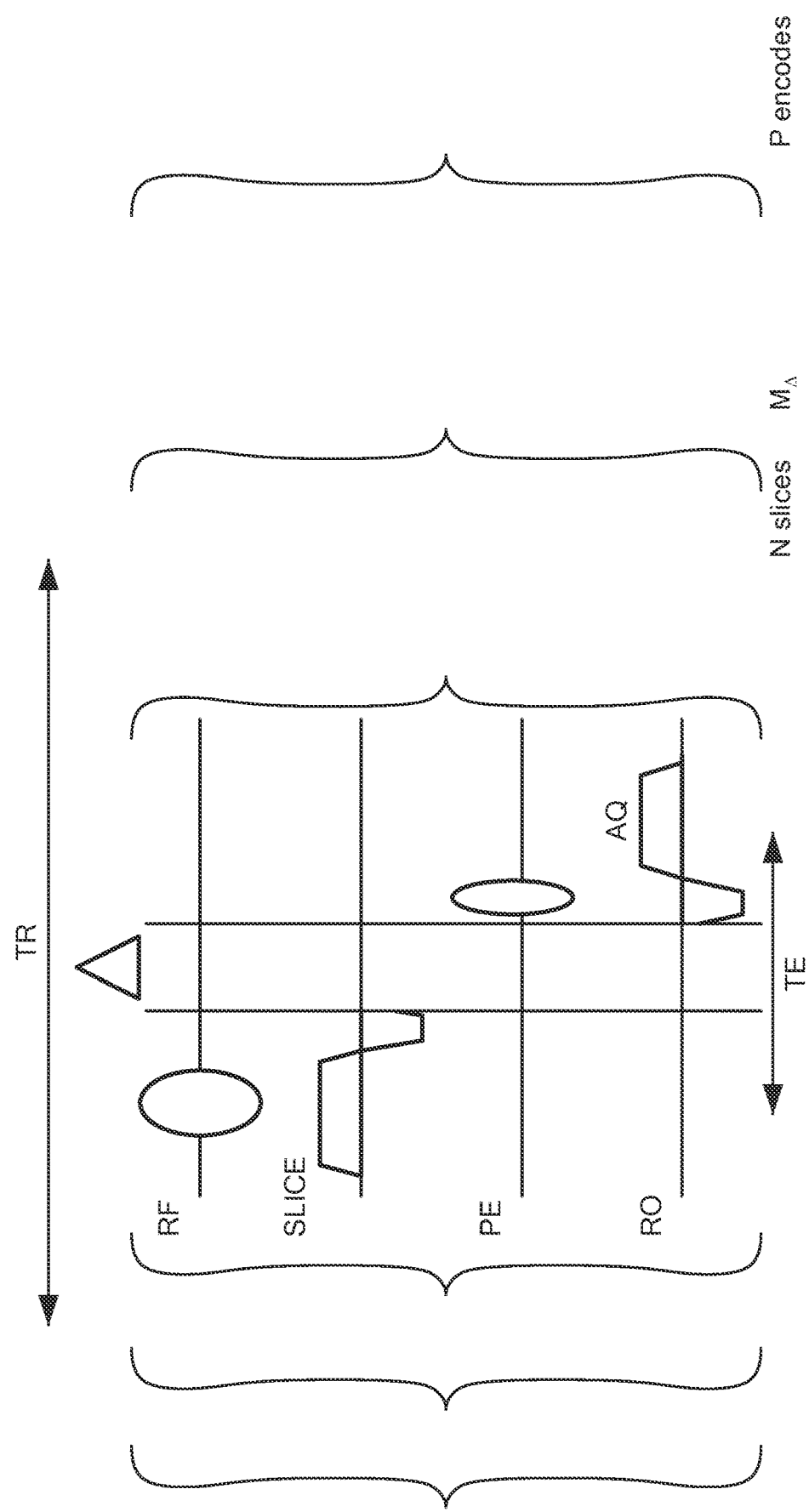
FIG. 2 shows a conventional gradient echo pulse sequence for $B_0$ mapping.

FIG. 2 shows a conventional gradient echo pulse sequence for $B_0$ mapping. The sequence generally includes: a slice selective RF pulse (RF, SLICE) followed by a variable delay, Δ, an incremented phase encoding gradient (PE) and a readout gradient (RO). The acquisition is successively looped over N slices, M TE times, and finally P phase encode steps.

$B_0$ mapping is commonly achieved using gradient echo images acquired with two or more different echo times. For samples or tissues with a single dominant resonance (e.g. water) the phase of the acquired images is given by the product of the difference in frequency of the dominant resonance from the carrier frequency (Δv) and the echo time (TE) and a spatially varying constant ($\phi_0(r)$) dependent on a number of parameters including RF coil system, reconstruction method and other instrumental factors.

$$\phi = 2\pi \cdot \Delta v \cdot TE + \phi_0(r) \qquad \text{Eq. 1}$$

Thus the phase difference, Δϕ, between any two images is given by [2], such that the only unknown is the frequency offset Δv.

$$\Delta\phi = 2\pi \cdot \Delta v \cdot \Delta TE \qquad \text{Eq. 2.}$$

Thus, assuming a single dominant resonance such that the distribution of frequencies in the image are solely related to the distribution of $B_0$ field present, the spatial variation in Δϕ provides a direct measure of the inhomogeneity ($\Delta B_0$) present in the sample or tissue.

For a given level of phase noise ($\epsilon_{phase}$) and constant signal level, the measured phase ($\Delta\phi_{msd}$) and true phase ($\Delta\phi_{true}$) and measured ($\Delta v_{msd}$) and true frequencies ($\Delta v_{true}$) are given by Eqs. 3 and Eq. 4.

$$\Delta\phi_{msd} = \Delta\phi_{true} + \epsilon_{phase} \qquad \text{Eq. 3}$$

$$\Delta v_{msd} = \Delta v_{true} + \frac{\epsilon_{phase}}{2\pi \cdot \Delta TE} \qquad \text{Eq. 4}$$

Thus the accuracy of the measurement generally increases with increasing ΔTE.

However, since the phase $\Delta\phi_{msd}$ is periodic, with periodicity 2π, such that for long ΔTEs (i.e. more accurate measurements) if $\Delta v_{true} > 1/(2 \cdot \Delta TE)$ the phase will alias such that the true phase and frequency is given by Eq. 5 and Eq. 6 with n being an integer describing the amount of wrapping.

$$\Delta\phi_{true} = \Delta\phi_{msd} + 2n\pi + \epsilon_{phase} \qquad \text{Eq. 5}$$

$$\Delta v_{true} = \Delta v_{msd} + \frac{n}{\Delta TE} + \frac{\epsilon_{phase}}{2\pi \cdot \Delta TE} \qquad \text{Eq. 6}$$

Figure 3A:
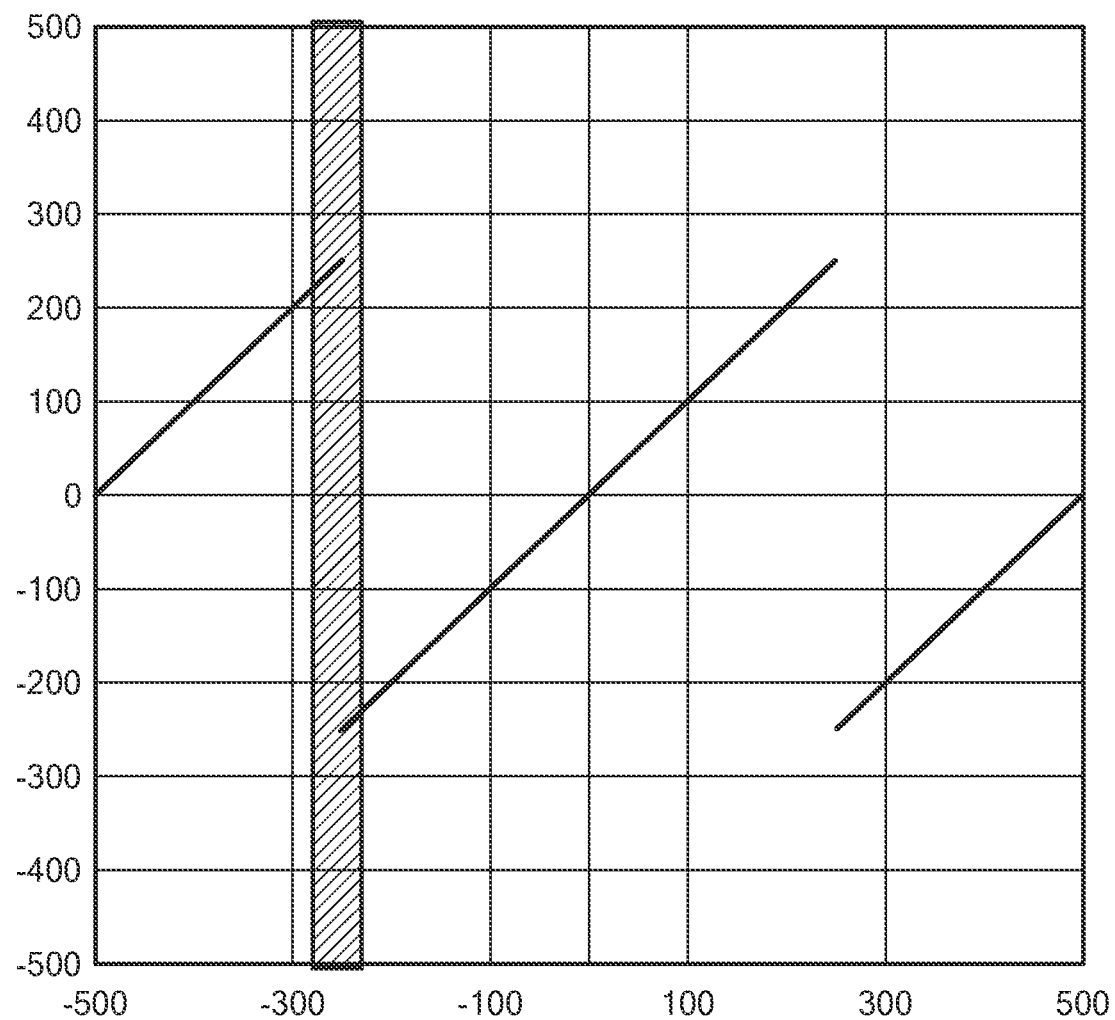
FIGS. 3A and 3B show Aliasing and Uncertainty in $B_0$ Mapping.
Figure 3B:
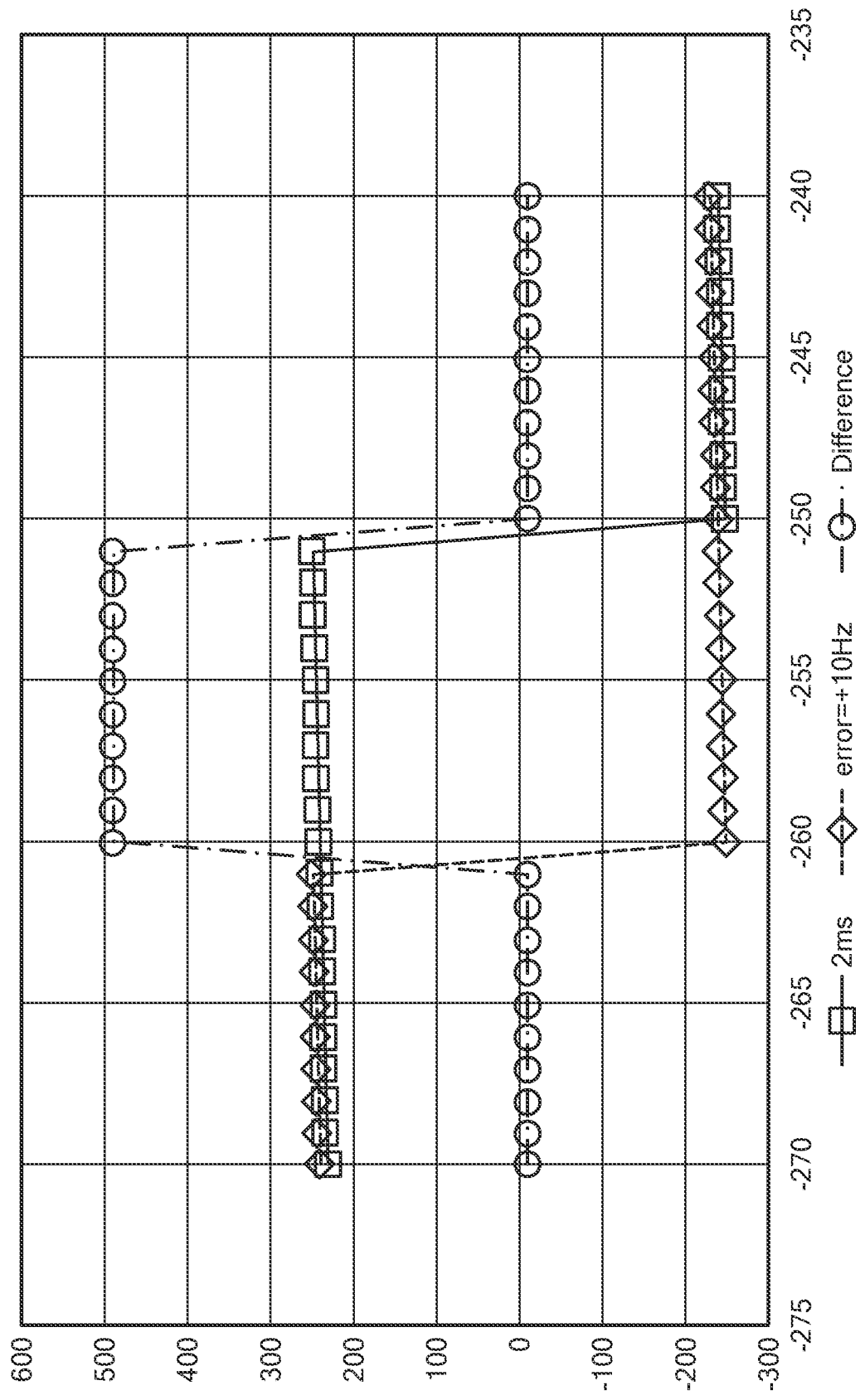

Thus $\Delta v_{true}$ may not be uniquely determined in the presence of wrapping and noise/uncertainty. Thus the most accurate (longest ΔTE) is prone to large systematic errors due to aliasing. For example, FIG. 3A shows the measured values ($\Delta v_{msd}$) along the vertical axis as a function of the true value ($\Delta v_{true}$) along the horizontal axis for a ΔTE=2 ms image over the range of +500 Hz. The wrapping points are at ±250 Hz. Displayed in FIG. 3B (lines added for visualization) is an expansion of the region from −270 to −240 Hz (box in FIG. 3a) displaying $\Delta v_{msd}$ for the ΔTE=2 ms image and a ΔTE=2 ms with an "error" of +10 Hz. For values between −270 and −260 Hz, both images alias and their difference is −10 Hz. However from −260 to −250 Hz, the ΔTE=2 ms image with a +10 Hz error term does not alias, while the ΔTE=2 ms images does resulting a difference of +490 Hz.

Methods of Unwrapping

To overcome this limitation two broad methods, spatial and temporal unwrapping have been described to unalias the data. See, for example: Jenkinson, M., *Fast, automated, N-dimensional phase-unwrapping algorithm*. Magn Reson Med, 2003. 49(1): p. 193-7; Hetherington, H. P., et al., *Robust fully automated shimming of the human brain for high-field 1H spectroscopic imaging*. Magnetic resonance in medicine, 2006. 56(1): p. 26-33; Robinson, S., H. Schodl, and S. Trattnig, *A method for unwrapping highly wrapped multi-echo phase images at very high field: UMPIRE*. Magn Reson Med, 2014. 72(1): p. 80-92; Geiger, Y. and A. Tal, *Optimal echo times for multi-gradient echo-based B0 field-mapping*. NMR Biomed, 2020. 33(7): p. e4316; and Dagher, J., T. Reese, and A. Bilgin, High-resolution, large dynamic range field map estimation. Magn Reson Med, 2014. 71(1): p. 105-17, each of which is incorporated herein by reference in its entirety.

Spatial unwrapping relies on the spatial continuity of the data to identify discontinuities in the $B_0$ data as indicators of aliasing. See Jenksinson et al. These methods perform acceptably under conditions of moderate wrapping (i.e. moderate values of ΔTE), such that the accuracy of the measurements is limited by the LITE used. For temporal unwrapping, multiple ΔTE values are used, with the shortest ΔTE chosen to eliminate aliasing (see Hetherington et al.), i.e. $\Delta TE_{min} < 1/BW_{max} = 1/(2 \cdot |\Delta v_{max}|)$. Under this condition, the values in the shortest ΔTE are used to "correct" aliased values in longer ΔTE images. Unfortunately, if the maximum uncertainty in the shortest ΔTE image $\epsilon^{max}$, $$\epsilon^{max} = k \cdot \frac{\epsilon_{phase}}{2\pi \cdot \Delta TE},$$

where k is a scaling value such that all "outliers" are included, exceeds the bandwidth of the longer ΔTE image (1/ΔTE) the extent of aliasing will be ambiguous. Thus the "longer" ΔTE image cannot use an arbitrarily long ΔTE. For a normal distribution of noise/uncertainty, with $$\frac{\epsilon_{phase}}{2\pi \cdot \Delta TE}$$

being me standard deviation of the noise/uncertainty in the frequency domain, k would reflect number of standard deviations to account for the maximum noise value present in the sample To overcome this limitation previously, a multi-ΔTE acquisition used a "boot strap" approach where: 1) the initial ΔTE value is chosen to be sufficiently short to eliminate aliasing; 2) each subsequent ΔTE image uses a factor of 2 in increasing duration and 3) each subsequent ΔTE image is used as the reference image to unwrap the next longest ΔTE image. Thus as the accuracy increases and bandwidth decreases in each subsequent image, the uncertainty in the "reference" ΔTE image decreases preserving the ability to unwrap the data unambiguously. However this method is limited by 1) the requirement to capture all inhomogeneity present (i.e. preclude aliasing) in the shortest ΔTE image and 2) the number of images required to get to arbitrarily long ΔTE values for a desired level of accuracy. These limitations manifest as longer acquisition times (more ΔTE images) for both increasing initial inhomogeneity and final accuracy.

Logistical Temporal Unwrapping

In illustrative embodiments of the invention, logistical temporal unwrapping provides the following unique advantages: 1) aliasing in the shortest ΔTE image is allowed, minimizing the need to accurately predict the maximum inhomogeneity present; and 2) the ΔTE values used can lengthen by factors larger than 2, enabling greater accuracy with fewer ΔTE images and thus shorter acquisition times. This methodology achieves these advantages by 1) using the longer ΔTE images to unwrap aliasing in the shortest ΔTE image and 2) utilizing the patterns of aliasing in all images to unwrap the most accurate image, i.e. the longest ΔTE image.

Unwrapping Aliasing in the Shortest TE Image

Aliasing results in discontinuities in the measured phase at well-defined frequency values in the bandwidth of the measurement. By comparing the measured values in the shortest ΔTE image with that measured in the longer ΔTE images, aliasing can be detected. Specifically a logistic temporal unwrapping parameter (LTUP) can be calculated, which enables the detection of wrapping in the shortest ΔTE image.

$$LTUP = (\Delta v_{short} - \Delta v_{long})/(BW_{long}/2)$$

Figure 4:
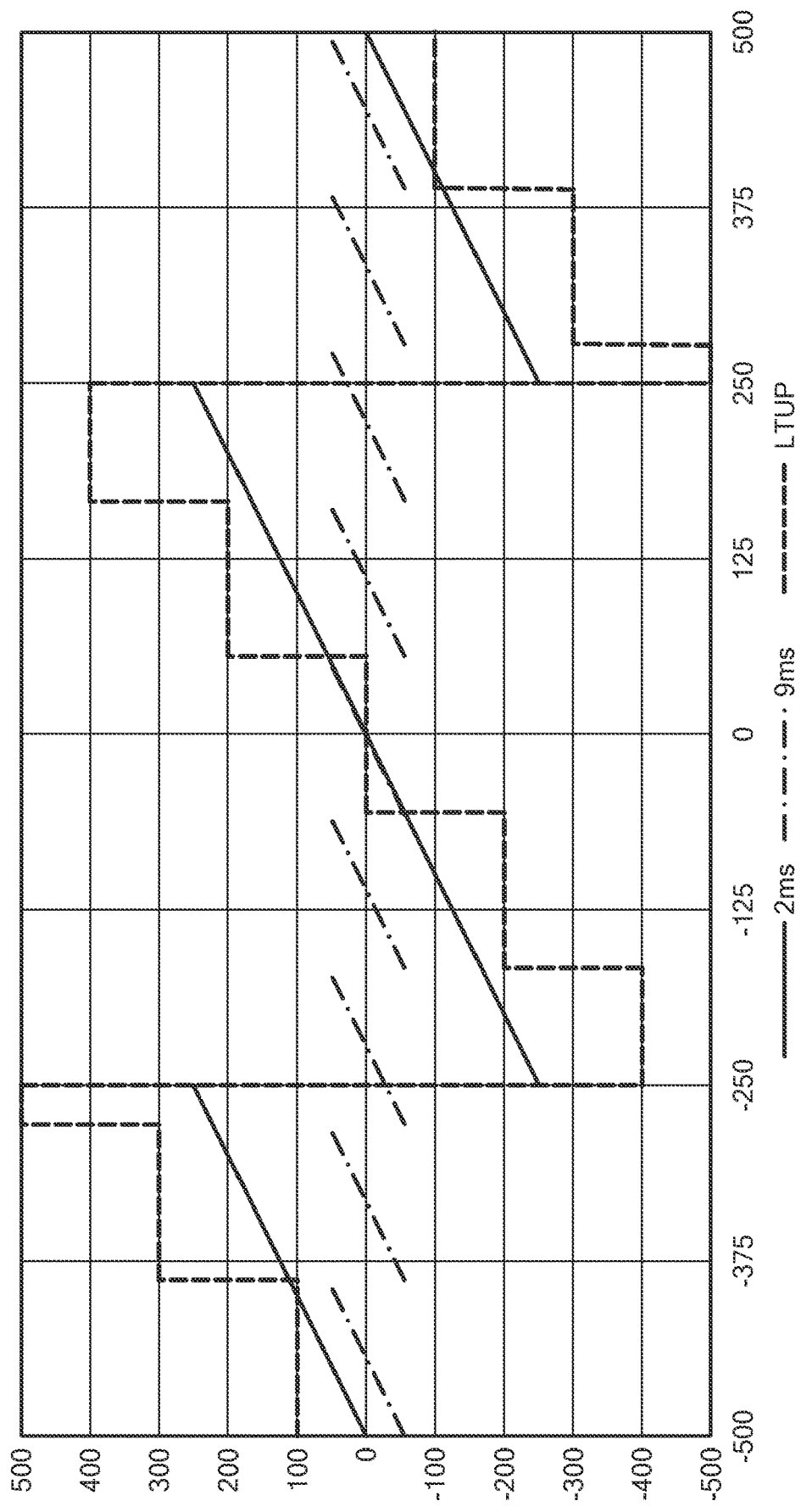
FIG. 4 shows an example of logistical temporal unwrapping, in accordance with embodiment of the invention.

FIG. 4 displays an example of the process graphically using ΔTE values of 2 and 9 ms (based on three MRI images with TE times of 4, 6 and 13 ms) with up to a factor of 2 in aliasing (±500 Hz, maximal expected bandwidth) present in the 2 ms image, in accordance with an embodiment of the invention. When the value of the LTUP is (LTUP=0,±2, or ±4, i.e., even numbers) the measured value in the shortest ΔTE image is unaliased, whereas if the value is (LTUP=±1, ±3,±5, i.e., odd numbers) the value is aliased and can be corrected. For example, in the past conventional methodology, to achieve a true bandwidth of ±500 Hz, and achieve reasonable accuracy 4 ΔTEs would be acquired (i.e. 1, 2, 4 and 8 ms). Whereas, under the current method, only 2 LTEs would be acquired yielding equivalent maximal bandwidth, but with superior accuracy (9 vs 8 ms) with fewer ΔTEs (2 versus 4).

Figure 5:
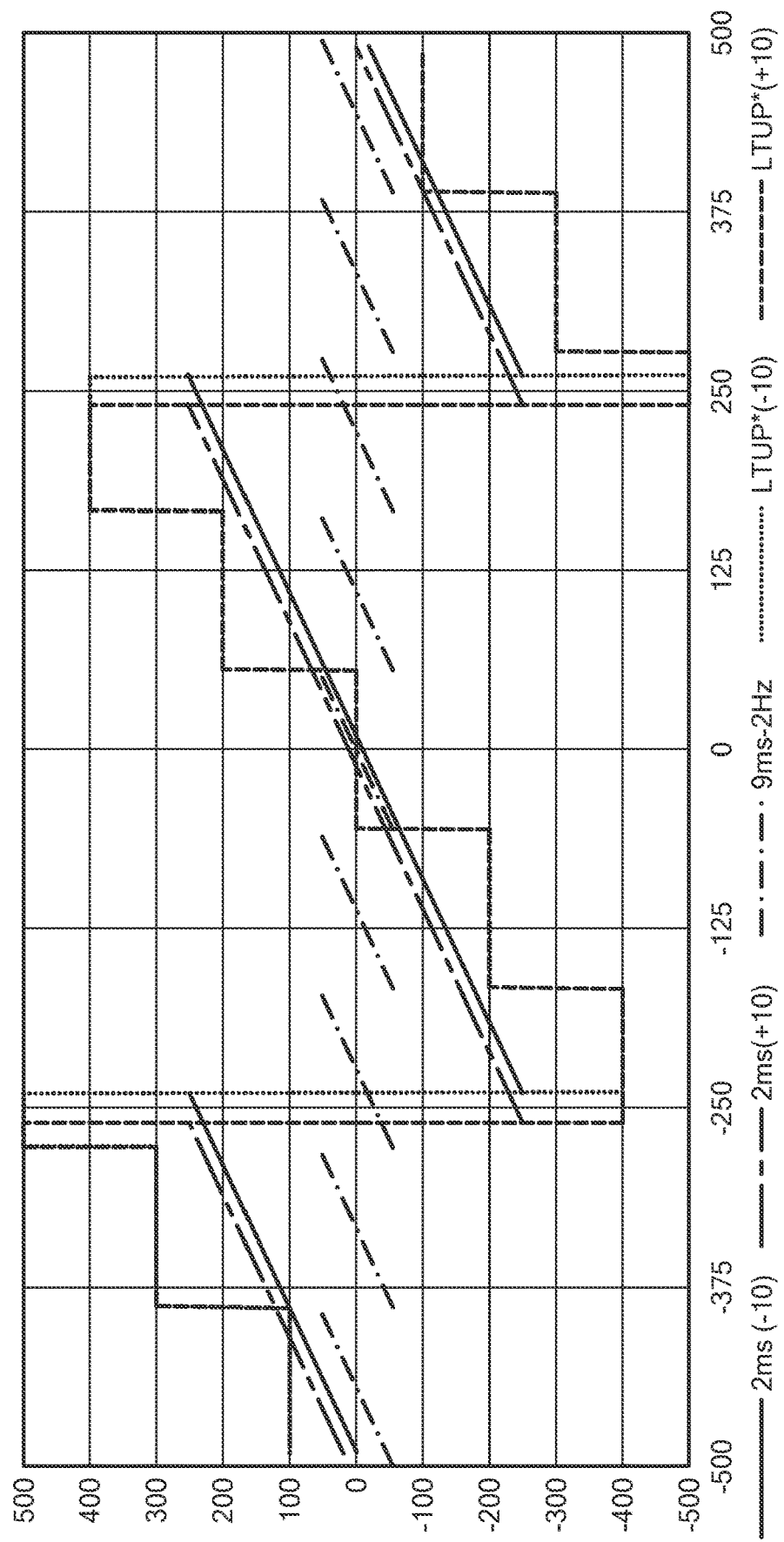
FIG. 5 shows the effects of uncertainty on LTUP in the $\Delta TE=2$ ms image, in accordance with an embodiment of the invention.

The effects of noise/uncertainty in the measurements is most pronounced at the aliasing points, where a few Hz of "noise" can dramatically change the measured values. For example, for a true value of 250 Hz, if $\in^{max}=10$ Hz in the ΔTE=2 ms image, the "true" value will map into a set of values between +240 Hz and +260 Hz. However, due to aliasing this set of true values {240, 244, ... 260} maps into the values {240, 241, ... 250, −249, −248, ... −240}. This is graphically represented in FIG. 5, which shows the effects of uncertainty in the LTE=2 ms image on LTUP, in accordance with an embodiment of the invention, by two lines 2 ms (−10 Hz) and 2 ms (+10 Hz) representing the extremes of the numerical range. Assuming $\in^{max} \sim 0$ in the ΔTE=9 ms image, the true value of 250 Hz maps into a value of 27.8 Hz in the ΔTE=9 ms image. However, due to the uncertainty in the ΔTE=2 ms image, the LTUP can take on not only non-integral values, e.g. (240−27.7)/55.6=+3.82, but also very different values when the frequency is aliased, e.g. (−240/−27.7)/55.6~−4.81.

The non-integral values of LTUP can be addressed by calculating LTUP*, where LTUP*=round(LTUP). After correction for non-integral values, however LTUP*=−5 or +4. Similarly for frequencies within $\pm\in^{max}$ of −250 Hz, the LTUP* can take on values of −4 or +5. However, the set of LTUP* values over these two regions are distinct, such that the LTUP* can still be used to determine if the value has aliased or not. For example if the true frequency is 245 Hz, the ±10 Hz limits will place the measured value between 235 and 255 Hz, yielding value of 235 to 250 and −250 to −245 Hz in ΔTE=2 ms image with two possible LTUP* values, +4 and −5. This range of values in the ΔTE=2 ms image could also have been generated by a true frequency of −255 Hz, with LTUP* values of −4 and +5. Outside of the potential aliasing regions, the calculated LTUP* values for the extremes of uncertainty in the ΔTE=2 ms image are coincident (FIG. 5) and no ambiguity for aliasing exists. Thus the LTUP*, even in the presence of noise provides unambiguous unwrapping over these regions.

Unwrapping the $\Delta TE_{long}$ Image

Figure 6:
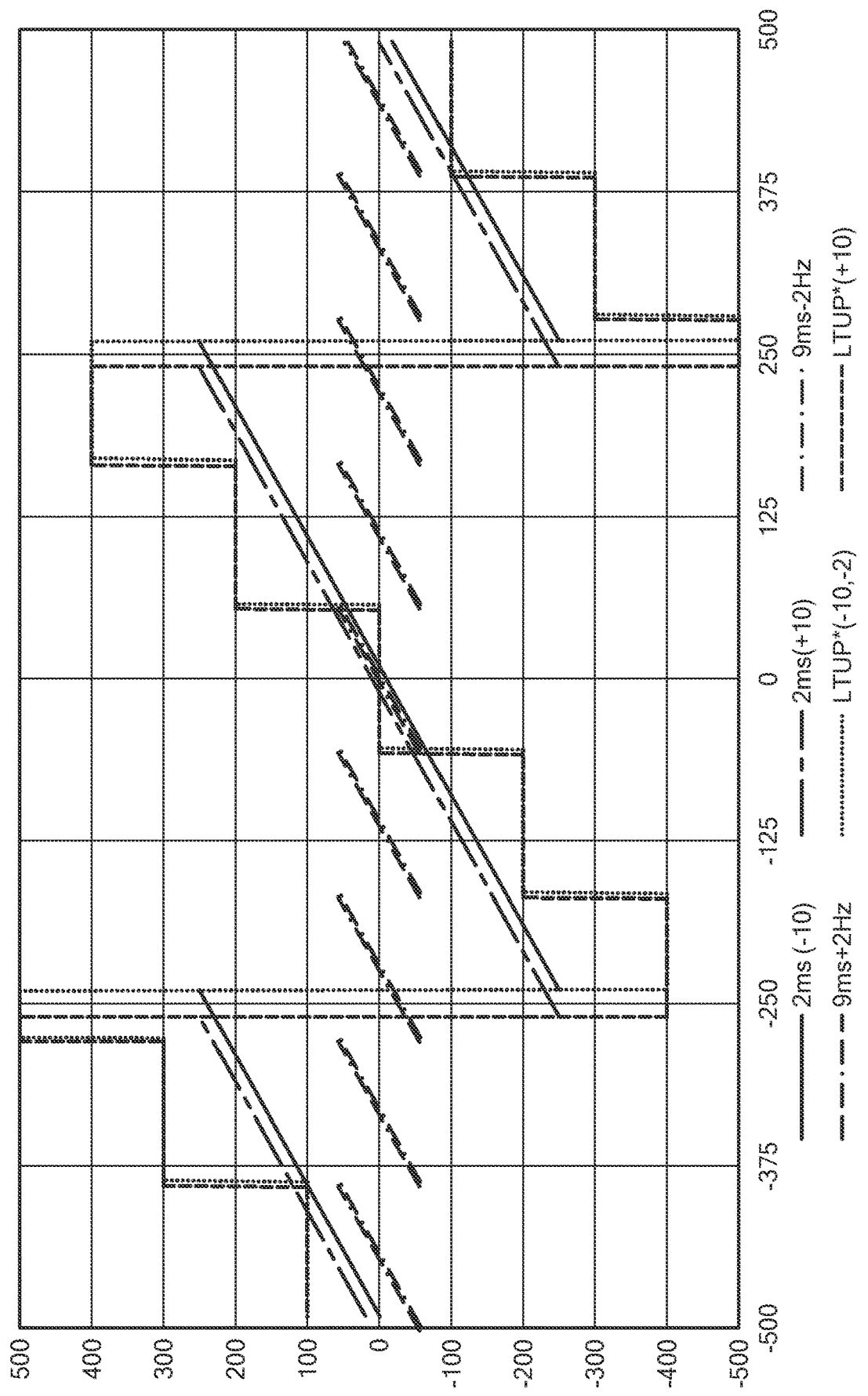
FIG. 6 shows the effects of uncertainty in the $\Delta TE=2$ ms image and the $\Delta TE=9$ ms image, in accordance with an embodiment of the invention.

Once the ΔTE=2 ms image has been unwrapped and $\Delta v_{short}^{unwrap}$ is outside of $\pm\in_2$ (the uncertainty/noise), of the alias point of the image±1/(2ΔTE$_{long}$), $\Delta v_{long}^{msd}$ can also be unwrapped. FIG. 6 assists in showing the unwrapping the $\Delta TE_{long}$ Image, in accordance with an embodiment of the invention (FIG. 6 includes experimental uncertainty in both the ΔTE 2 ms and 9 ms images). Specifically, for each $\Delta v_{long}^{msd}$ in the ΔTE=9 ms image there are nine theoretical potential values in the ΔTE=9 ms image, $\Delta v_{short}^{potential}(n)$, which are given by:

$$\Delta v_{short}^{potential}(n) = \Delta v_{long}^{msd} + n(1/\Delta TE_{long}) \text{ where } n=0, \pm1,\pm2,\pm3,\pm4 \qquad \text{Eq. 8}$$

forming the pairs $$\{(\Delta v_{short}^{potential}(-4), \Delta v_{long}^{msd}) \ldots (\Delta v_{short}^{potential}(0), \Delta v_{long}^{msd}) \ldots (\Delta v_{short}^{potential}(+4), \Delta v_{long}^{msd})\}$$

Thus the unwrapped value ΔTE=9 ms image, $\Delta v_{long}^{unwrap}$, is achieved by selecting the nth pair of values, minimizing $\varepsilon_{short}(n)$ where $$\varepsilon_{short}(n) = |\Delta v_{short}^{potential}(n) - \Delta v_{short}^{unwrap}|. \qquad \text{Eq. 9}$$

However, if the value of $\Delta v_{long}^{msd}$ is within $\pm\in_{long}$ (the uncertainty/noise) of the alias point of the image±1/(2ΔTE$_{long}$), "false" aliasing due to noise may have occurred. If "false" aliasing due to noise does occur, $\varepsilon_{short}(n)$ will be larger than $\in_{short}$, the uncertainty in the ΔTE$_{short}$ image. In this case the value $\Delta v_{short}^{unwrap}$ is used for $\Delta v_{long}^{unwrap}$ at this location to unwrap the $\Delta TE_{long}$ image.

Alternatively, the process of unwrapping can be more generally viewed from the perspective of pattern matching, i.e. the finding the best numerical agreement between pairs of measured values (i.e. $\{(\Delta v_{short}^{msd}, \Delta v_{long}^{msd})\}$ and then sets of theoretical potential pairs i.e. $\{(\Delta v_{short}^{potential}(n), \Delta v_{long}^{potential}(n)), \ldots \}$ of values, where the number of pairs is dependent upon the extent of aliasing and maximum bandwidth.

Thus, in general, in the presence of noise or uncertainty in the $\Delta TE_{long}$ image, unambiguous unwrapping can be achieved if uncertainties in the frequency region about the alias points in the image are spanned by continuous sets of differing values from the $\Delta TE_{short}$ image. Continuity of these values in the $\Delta TE_{short}$ image is achieved when the specific $\Delta TE$ values for both the $\Delta TE_{short}$ and $\Delta TE_{long}$ images are chosen such that the alias points$\pm\epsilon^{max}$ do not overlap. Once the $\Delta TE_{short}$ image is unwrapped, the $\Delta TE_{long}$ image can be unwrapped.

As described, we have allowed for noise and uncertainty in the $\Delta TE_{short}$ image but not the $\Delta TE_{long}$ image(s). The presence of noise or uncertainty in the $\Delta TE_{long}$ image pixels with true values near the alias points of the $\Delta TE_{long}$ image can result in multiple LTUP* values. To unalias the $\Delta TE_{short}$ image the regions of uncertainty about the alias points in the short $\Delta TE$ image are extended by the noise in the $\Delta TE_{long}$ image, i.e. $\epsilon_{max} = \epsilon_{short}^{max} + \epsilon_{long}^{max}$. As long as these bands, alias points$\pm\epsilon^{max}$, are within the continuous region of the $\Delta TE_{long}$ image, the $\Delta TE_{short}$ image can be unaliased as described previously (see FIG. 5) using the LTUP*. Since the $\Delta TE_{short}$ image is continuous over these regions, the $\Delta TE_{long}$ image can be unwrapped as described previously by creating the set of paired values $\{(\Delta v_{short}^{potential}(n), \Delta v_{long}^{msd})\}$ and selecting the nth pair such that $\epsilon_{short}(n)$ is a minimum or $\Delta v_{short}^{unwrap}$ when near the wrap points of the $\Delta TE_{long}$ image and $\epsilon_{short}(n)$ is large.

Creating Very High Accuracy Maps with Additional $\Delta TE$ Images.

As described, we have utilized 2 $\Delta TE$ images ($\Delta TE_1 = \Delta TE_{short}$, $\Delta TE_2 = \Delta TE_{long}$) to generate a $B_0$ map. However, the $\Delta TE$ times chosen are limited by the maximum bandwidth of the sample, the aliasing patterns and the uncertainty in the individual $\Delta TE$ maps. Thus in general arbitrarily long $\Delta TE$ times for very high accuracy may not be possible under conditions of significant uncertainty and large sample bandwidth. To overcome this limitation additional $\Delta TE$ times ($\Delta TE_3$, $\Delta TE_4$, . . . ) can be acquired with increasing length. Each additional $\Delta TE$ image then forms a new "pair" of images, with the long $\Delta TE$ image from the previous pair (e.g. $\Delta TE_2$) now serving as the short $\Delta TE$ image and the new image (e.g. $\Delta TE_3$) serving as $\Delta TE_{long}$. Since the new $\Delta TE_{short}$ image has already been unwrapped the requirement for non-overlapping alias point regions, can be relaxed, and the new $\Delta TE$ chosen must only satisfy the criteria that the maximal uncertainty in the new pair of images (e.g for ($\Delta TE_2$, $\Delta TE_3$), $\epsilon^{max} = \epsilon_2^{max} + \epsilon_3^{max}$, be less than the bandwidth of the new $\Delta TE$ image, (e.g. $1/\Delta TE_3$). Thus the process becomes recursive for each $\Delta TE$ image. Notably, as described previously, the multiplicative factor used in increasing the length of subsequent $\Delta TE$ times is not constrained by a factor of 2, but rather the actual noise/uncertainty in the images. This allows for very efficient increases in accuracy per additional $\Delta TE$ image acquired. At some point, the noise/uncertainty in the longer $\Delta TE$ image may not decrease inversely with increasing duration.

Figure 7:
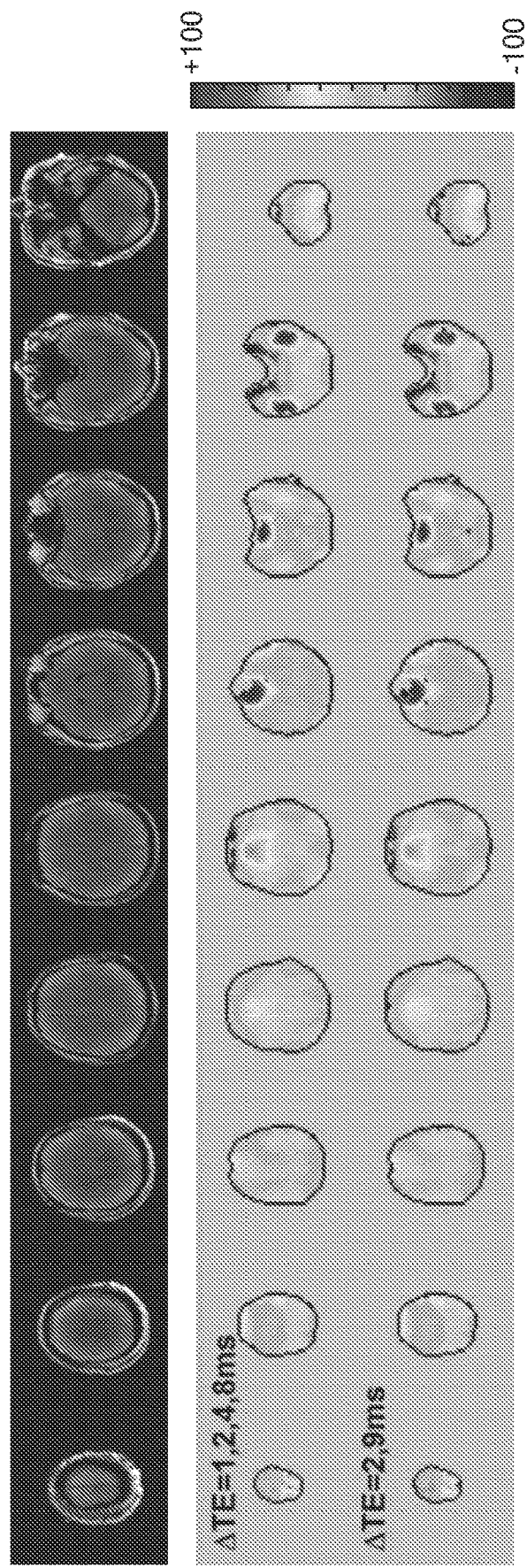
FIG. 7 compares images and $B_0$ maps acquired from a healthy subject using conventional methodology; and using the Logistical Temporal Unwrapping methodology in accordance with embodiments of the invention.

FIG. 7 compares scout images and $B_0$ maps acquired from a healthy subject using conventional methodology using $\Delta TE$ times of 1, 2, 4 and 8 ms; and using the Logistical Temporal Unwrapping methodology in accordance with embodiments of the invention, with $\Delta TE$ times of 2 and 9 ms. The maps display every 4th slice in the image set, from a set of 33 slices. The images are plotted on a scale of $\pm 100$ Hz. The target region of interest for shimming is shown in red on the scout images (top row) and black on the $B_0$ maps. Despite fewer $\Delta TE$ times, the Logistical Temporal Unwrapping methodology shows a small but significant reduction (10%, 20.2 versus 22.5) in standard deviation of $B_0$ over the entire brain in comparison to the conventional method. This is consistent with the lengthening of the maximum echo time from 8 ms to 9 ms (12.5%).

Figure 8:
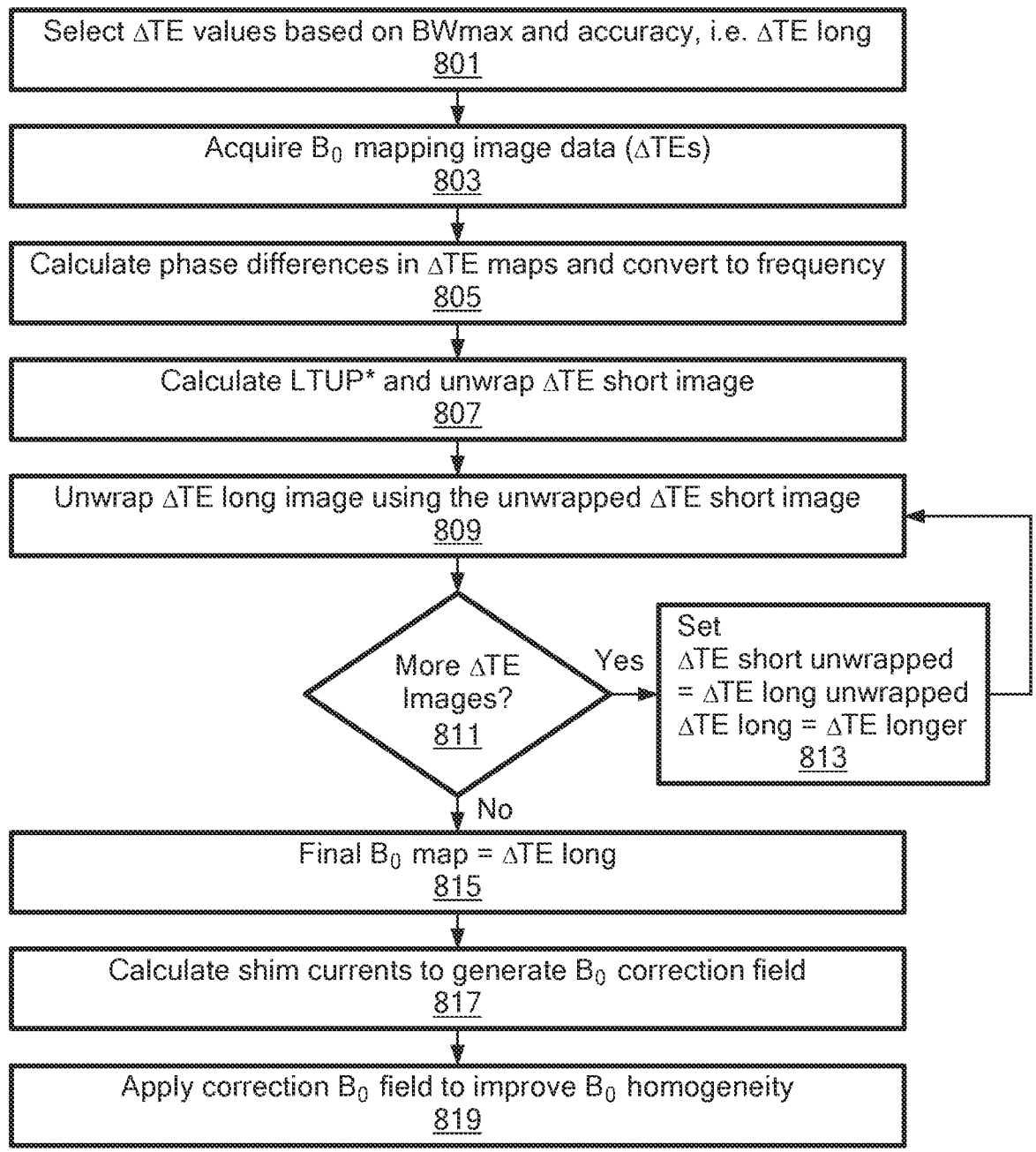
FIG. 8 is an illustrative flow diagram of a Logistical Temporal Unwrapping methodology, in accordance with an embodiment of the invention.

FIG. 8 is an illustrative flow diagram of a Logistical Temporal Unwrapping methodology, in accordance with an embodiment of the invention. At step 801, the varying echo times (TE) are selected based on $BW_{max}$ and accuracy, which may be determined, for example, by $\Delta TE$ long. The $B_0$ mapping image data is then acquired, step 803. Illustratively, at least two $\Delta TE$ images ($\Delta TE_{i=1 \ldots N}$) may be generated based on at least three MRI images, wherein the subscripts i=1 . . . N refer to images with sequentially increasing $\Delta TE$ times. Advantageously, aliasing in the $\Delta TE_1$ image is permitted, and the $\Delta TE$ times of $\Delta TE_1$ and $\Delta TE_2$ are set such that the alias points at which wrapping occurs in $\Delta TE_1$ does not overlap with the alias points of $\Delta TE_2$. The phase differences in the $\Delta TE$ images are calculated in the $\Delta TE$ maps are calculated and converted to frequency, step 805. Each $\Delta TE$ image is then unwrapped. More specifically, as an example, LTUP* is calculated and the $\Delta TE_1$ (short image) is unwrapped, step 807. Then, the $\Delta TE_2$ (long image) is unwrapped using the unwrapped $\Delta TE_1$ (short image), step 809. If there are more $\Delta TE$ images, step 811, set the unwrapped $\Delta TE$ (short image) to the unwrapped $\Delta TE$ (long image), and the $\Delta TE$ (long image) to the next longest $\Delta TE$ image, step 813. If there are no more $\Delta TE$ images at step 811, set the final $B_0$ map to the last unwrapped $\Delta TE_N$ (long image), step 815. The shim currents and/or passive shims may then be calculated to generate the $B_0$ correction field, step 817, which may then be applied to improve the $B_0$ homogeneity.

Illustratively, the following is a more specific algorithm for unwrapping and setting of the final B0 map, in accordance with an embodiment of the invention.

1. Select a set of evolution times,
   a. A minimum of 3 evolution times to generate at least 2 $\Delta TE$ images
   b. Select the individual $\Delta TE$ times in the first two $\Delta TE$ image such that the frequency regions about the alias points ($2/\Delta TE$), including the maximal uncertainty ($\epsilon_{short}^{max} + \epsilon_{long}^{max}$), do not overlap over the range of maximum expected frequencies ($BW_{max}$) in the sample or tissue.
   c. Select additional $\Delta TE$ times such that ($\epsilon_{short}^{max} + \epsilon_{long}^{max}$)$<BW_{long}$, where the subscripts short and long refer to images with sequentially increasing $\Delta TE$ times.
   d. Aliasing in the $\Delta TE_{short}$ image is permitted over $BW_{max}$.
2. Acquire the data.
3. Calculate the phase in the $\Delta TE$ images and convert to frequency.

$$\Delta v_{msd} = \frac{\Delta \phi_{msd}}{2\pi \Delta TE}$$

4. Unwrap the $\Delta TE_{short}$ image:
   a. Divide the bandwidth of the $\Delta TE_{short}$ image into two conceptual regions:
      i. Frequencies within $\epsilon_{short}^{max} + \epsilon_{long}^{max}$ of the alias points of the $\Delta TE_{short}^{image}$
      ii. Frequencies outside of this region
   b. For frequencies within region (ii)
      i. Calculate the sets of theoretical values for LTUP* over $BW_{max}$ as a function of extent of aliasing ($n=0,\pm 1, \ldots$)

ii. Calculate LTUP* from the measured data $LTUP^*=ROUND((\Delta v_{short}^{msd}-\Delta v_{long}^{msd})/(BW_{long}/2))$ iii. Use the measured LTUP* to look up the value of n from the theoretical values in 4.b.i iv. Calculate $\Delta v_{short}^{unwrap}=\Delta v_{short}^{msd}+n \cdot BW_{short}$, c. For frequencies within region (i)

i. Perform the same calculation as in 4.b.i over the range of frequencies spanned by the alias point± ($\epsilon_{short}^{max}+\epsilon_{long}^{max}$)

ii. Calculate LTUP* from the measured data $LTUP^*=ROUND((\Delta v_{short}^{msd}-\Delta v_{long}^{msd})/(BW_{long}/2))$ iii. Use the measured LTUP* to look up the value of n from the set of theoretical values in 4.c.i. Each aliased region will have multiple but distinct LTUP* values for a given value of n.

iv. Calculate $\Delta v_{short}^{unwrap}=\Delta v_{short}^{msd}+n \cdot BW_{short}$, 5. Unwrap the long $\Delta TE$ image:

a. Using the measured value in the $\Delta TE_{long}$ image calculate the potential pairs of frequency values for the $(\Delta v_{short}^{potential}(n), \Delta v_{long}^{msd})$ over $BW_{max}$ $\{(\Delta v_{short}^{potential}(n), \Delta v_{long}^{msd}) \ldots \}$ where $\Delta v_{short}^{potential}(n)=\Delta v_{long}^{msd}+n(1/\Delta TE_{long})$ b. Calculate $\epsilon_{short}(n)=|\Delta v_{short}^{potential}(n)-\Delta v_{short}^{unwrap}|$ for each pair c. Select the value of n that minimizes $\epsilon_{short}(n)$.

d. If $\epsilon_{short}(n)<\epsilon_{short}^{max}$ Assign $\Delta v_{long}^{unwrap}=\Delta v_{long}^{msd}+n(1/\Delta TE_{long})$
If $\epsilon_{short}(n)>\epsilon_{short}^{max}$ Assign $\Delta v_{long}^{unwrap}=\Delta v_{short}^{unwrapped}$ 6. Unwrap additional longer $\Delta TE$ images ($\Delta TE_{longer}$) if present by . . . .

a. Substituting the parameters for the $\Delta TE_{short}$ image with those from the $\Delta TE_{long}$ image e.g. $\Delta v_{short}^{unwrap}=\Delta v_{long}^{unwrap}$ b. Substituting the parameters for the $\Delta TE_{long}$ image with those from the $\Delta TE_{longer}$ image e.g. $\Delta v_{long}^{msd}=msd\Delta v_{longer}^{msd}$ c. Repeating the calculation described in 5

7. After all images have been unwrapped, use the values from the longest $\Delta TE$ image to generate the final map.

8. Using the final $B_0$ map described in 7 calculate a set of shim currents and/or determine passive shimming for generating a correction $B_0$ field of approximately equal amplitude but opposite sign.

9. Apply the calculated shim currents and/or passive shims to reduce the $B_0$ inhomogeneity in the sample.

Figure 9:
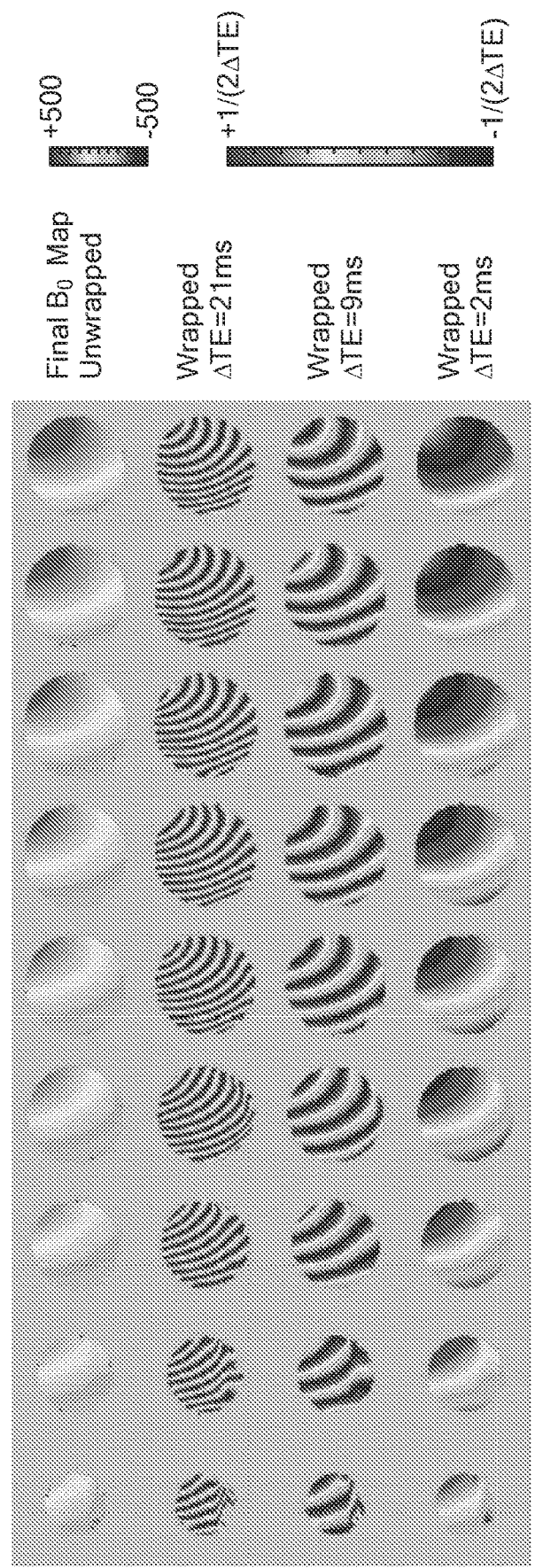
FIG. 9 shows three wrapped $\Delta TE$ maps and the final unwrapped $B_0$ map obtained from a spherical phantom, in accordance with various embodiments of the invention.

FIG. 9 shows three wrapped $\Delta TE$ maps and the final unwrapped $B_0$ map obtained from a spherical phantom, in accordance with various embodiments of the invention. More particularly, the figure shows nine slices from a set of 33 slices acquired from the spherical phantom in which the shims were purposely offset to generate a significant amount of inhomogeneity. The bottom three rows show the wrapped maps from the: $\Delta TE=2$ ms image (bottom row); 9 ms image; ($2^{nd}$ row from bottom); and 21 ms image, plotted on their scales of +/−BW/2 where BW=1/$\Delta TE$. The top row shows the final $B_0$ map obtained from the unwrapped last $\Delta TE=21$ ms map, using the above-described methodology and embodiments of the invention.

Embodiments of the invention may be located implemented in part in any conventional computer programming language. For example, preferred embodiments may be implemented in a procedural programming language (e.g., "C") or an object oriented programming language (e.g., "C++", Python). Alternative embodiments of the invention may be implemented as pre-programmed hardware elements, other related components, or as a combination of hardware and software components.

Embodiments also can be implemented in part as a computer program product for use with a computer system—for example, the controller of the MRI system described above. Such implementation may include a series of computer instructions fixed either on a tangible medium, such as a computer readable medium (e.g., a diskette, CD-ROM, ROM, or fixed disk) or transmittable to a computer system, via a modem or other interface device, such as a communications adapter connected to a network over a medium. The medium may be either a tangible medium (e.g., optical or analog communications lines) or a medium implemented with wireless techniques (e.g., microwave, infrared or other transmission techniques). The series of computer instructions embodies all or part of the functionality previously described herein with respect to the system. Those skilled in the art should appreciate that such computer instructions can be written in a number of programming languages for use with many computer architectures or operating systems. Furthermore, such instructions may be stored in any memory device, such as semiconductor, magnetic, optical or other memory devices, and may be transmitted using any communications technology, such as optical, infrared, microwave, or other transmission technologies. It is expected that such a computer program product may be distributed as a removable medium with accompanying printed or electronic documentation (e.g., shrink wrapped software), preloaded with a computer system (e.g., on system ROM or fixed disk), or distributed from a server or electronic bulletin board over the network (e.g., the Internet or World Wide Web). Of course, some embodiments of the invention may be implemented as a combination of both software (e.g., a computer program product) and hardware. Still other embodiments of the invention are implemented as entirely hardware, or entirely software (e.g., a computer program product).

Although various exemplary embodiments of the invention have been disclosed, it should be apparent to those skilled in the art that various changes and modifications can be made which will achieve some of the advantages of the invention without departing from the true scope of the invention.

What is claimed is:

1. A method for mapping and correcting an inhomogeneity of a magnetic field within an object using an Magnetic Resonance Imaging (MRI) system where there is a single dominant resonance, the method comprising:

acquiring at least three MRI images, each at different echo times (TE);

generating at least two $\Delta TE$ images, $\Delta TE_{i=1 \ldots N}$, based on the at least three MRI images, wherein subscripts i=1 . . . N refer to images with sequentially increasing $\Delta TE$ times, wherein aliasing in a $\Delta TE_1$ image is permitted, and wherein the $\Delta TE$ times of $\Delta TE_1$ and $\Delta TE_2$ are set such that alias points at which wrapping occurs in $\Delta TE_1$ does not overlap with alias points of $\Delta TE_2$; and unwrapping each $\Delta TE$ image, wherein unwrapping includes:

unwrapping aliasing in the $\Delta TE_1$ image based on information in a next longest $\Delta TE$ image, the $\Delta TE_2$ image, to form an unwrapped $\Delta TE_1$ image; and using the unwrapped $\Delta TE_1$ image to unwrap the next longest $\Delta TE$ image, the $\Delta TE_2$ image, wherein unwrapping the $\Delta TE_1$ image and $\Delta TE_2$ images includes calculating a logistic temporal unwrapping parameter (LTUP), where LTUP images a fractional difference measured between two $\Delta TE$ images into a set of values describing an extent of aliasing; and setting a final $B_0$ map to the unwrapped $\Delta TE_N$ image.

2. The method according to claim 1, further comprising: determining shim currents and/or passive shims based on the final $B_0$ map, so as to reduce $B_0$ inhomogeneity.

3. The method according to claim 2, further comprising applying the shim currents and/or passive shims to the object to reduce $B_0$ inhomogeneity in the object.

4. The method according to claim 2, wherein the shim currents and/or passive shims generate a $B_0$ field opposite in sign to the inhomogeneity of the magnetic field.

5. The method according to claim 1, wherein the at least two $\Delta TE$ images differ in their echo time (TE) such that a difference in resulting phase ($\Delta \phi$) of any two $\Delta TE$ images varies according to $\Delta \phi = \Delta TE \cdot \Delta v$, where $\Delta v$ is the difference in frequency at a voxel in the image from a central frequency, and $\Delta TE$ is the difference in echo time between any pair of images.

6. The method according to claim 1, wherein unwrapping each $\Delta TE$ image to form a final $B_0$ map further includes:
for i=3 to N, using a previously unwrapped $\Delta TE_{i-1}$ image to unwrap the $\Delta TE_i$ image.

7. The method according to claim 1, wherein using the unwrapped $\Delta TE_1$ image to unwrap the next longest $\Delta TE$ image, the $\Delta TE_2$ image includes using a numerical estimate of a difference between an unwrapped value in the $\Delta TE_1$ image with values representing different degrees of aliasing in the $\Delta TE_2$.

8. The method according to claim 1, wherein each of the MRI images is acquired using gradient echo, asymmetric spin echo, and/or stimulated echo acquisitions.

9. The method according to claim 1, wherein unwrapping each $\Delta TE$ image includes a single pattern matching algorithm to simultaneously unwrap each $\Delta TE$ images.

10. The method according to claim 1, wherein acquiring the at least three MRI images includes using simultaneous multi-slice methods, K-space undersampling in a phase encoding direction, and/or use of 2 and 3 dimensional readout trajectories, to decrease acquisition times.

11. A system for mapping and correcting an inhomogeneity of the magnetic field within an object using Magnetic Resonance Imaging (MRI) where there is a single dominant resonance, the system comprising:
an MRI imaging device for acquiring at least three MRI images, each at different echo times (TE), wherein the MRI imaging device includes a controller configured to:
generate at least two $\Delta TE$ images, $\Delta TE_{i=1 \ldots N}$, based on the at least three MRI images, wherein subscripts i=1 . . . N refer to images with sequentially increasing $\Delta TE$ times, wherein aliasing in a $\Delta TE_1$ image is permitted, and wherein the $\Delta TE$ times of $\Delta TE_1$ and $\Delta TE_2$ are set such that alias points at which wrapping occurs in $\Delta TE_1$ does not overlap with the alias points of $\Delta TE_2$;
unwrap each $\Delta TE$ image, wherein to unwrap each $\Delta TE$ image, the controller is configured to:
unwrap aliasing in the $\Delta TE_1$ image based on information in a next longest $\Delta TE$ image, $\Delta TE_2$ image, to form an unwrapped $\Delta TE_1$ image; and
use the unwrapped $\Delta TE_1$ image to unwrap the next longest $\Delta TE$ image, the $\Delta TE_2$ image,
wherein to unwrap the $\Delta TE_1$ image and $\Delta TE_2$ images, the controller is configured to include calculating a logistic temporal unwrapping parameter (LTUP), where LTUP images a fractional difference measured between two $\Delta TE$ images into a set of values describing an extent of aliasing; and
set a final $B_0$ map to the unwrapped $\Delta TE_N$ image.

12. The system according to claim 11, wherein the controller is further configured to determine shim currents and/or passive shims based on the final $B_0$ map, so as to reduce $B_0$ inhomogeneity.

13. The system according to claim 12, wherein the controller is further configured to apply the shim currents and/or passive shims to the object to reduce $B_0$ inhomogeneity in the object.

14. The system according to claim 12, wherein the shim currents and/or passive shims generate a $B_0$ field opposite in sign to the inhomogeneity of the magnetic field.

15. The system according to claim 11, wherein the at least two $\Delta TE$ images differ in their echo time (TE) such that a difference in resulting phase ($\Delta \phi$) of any two $\Delta TE$ images varies according to $\Delta \phi = \Delta TE \cdot \Delta v$, where $\Delta v$ is the difference in frequency at a voxel in the image from a central frequency, and $\Delta TE$ is the difference in echo time between any pair of images.

16. The system according to claim 11, wherein to unwrap each $\Delta TE$ image to form a final $B_0$ map, the controller is configured to: for i=3 to N, use a previously unwrapped $\Delta TE_{i-1}$ image to unwrap the $\Delta TE_i$ image.

17. The system according to claim 11, wherein to use the unwrapped $\Delta TE_1$ image to unwrap the next longest $\Delta TE$ image, the $\Delta TE_2$ image, the controller is further configured to use a numerical estimate of a difference between an unwrapped value in the $\Delta TE_1$ image with values representing different degrees of aliasing in the $\Delta TE_2$.

18. The system according to claim 11 wherein the MRI device acquired each of the MRI images using gradient echo, asymmetric spin echo, and/or stimulated echo acquisitions.

19. The system according to claim 11 wherein to unwrap each $\Delta TE$ image, the controller is configured to use a single pattern matching algorithm to simultaneously unwrap each $\Delta TE$ images.

20. The system according to claim 11, wherein the MRI device is configured to acquire the at least three MRI images using simultaneous multi-slice methods, K-space undersampling in a phase encoding direction, and/or use of 2 and 3 dimensional readout trajectories, so as to decrease acquisition times.

* * * * *